United States Patent [19]

Striffler

[11] Patent Number: 5,760,590
[45] Date of Patent: Jun. 2, 1998

[54] CABLE INTEGRITY TESTER

[75] Inventor: Foster L. Striffler, New London, Conn.

[73] Assignee: The United States of America as represented by the Secretary of the Navy, Washington, D.C.

[21] Appl. No.: 604,144

[22] Filed: Feb. 20, 1996

[51] Int. Cl.⁶ .................................................. G01R 27/26
[52] U.S. Cl. ........................... 324/514; 324/519; 324/513
[58] Field of Search ..................................... 324/514, 519, 324/513, 544, 686, 690

[56] References Cited

U.S. PATENT DOCUMENTS

| | | | |
|---|---|---|---|
| 2,794,169 | 5/1957 | Gooding | 324/514 |
| 2,882,491 | 4/1959 | Gooding | 324/514 |
| 3,047,800 | 7/1962 | Eigen | 324/514 |
| 3,096,478 | 7/1963 | Brown | 324/514 |
| 3,263,165 | 7/1966 | Eigen | 324/514 |
| 3,864,626 | 2/1975 | MacLean | 324/519 |
| 3,973,187 | 8/1976 | Cereijo | 324/519 |
| 4,177,097 | 12/1979 | Hudson | 324/519 |

Primary Examiner—Ernest F. Karlsen
Assistant Examiner—Jose M. Solis
Attorney, Agent, or Firm—Michael J. McGowan; William F. Eipert; Prithvi C. Lall

[57] ABSTRACT

A testing apparatus for determining the integrity of an electrical cable. Successive portions of electrical cable pass through an aqueous electrolyte with a distance measurement unit providing an indication of the position of a portion of the cable located in the electrolyte. A capacitance measurement unit connects to a selected conductor in the cable and to an electrode in the electrolyte to continuously generate a measured capacitance signal. An X-Y plotter produces an output that displays the measured capacitance as a function of the length of the cable passing through the electrolyte.

12 Claims, 5 Drawing Sheets

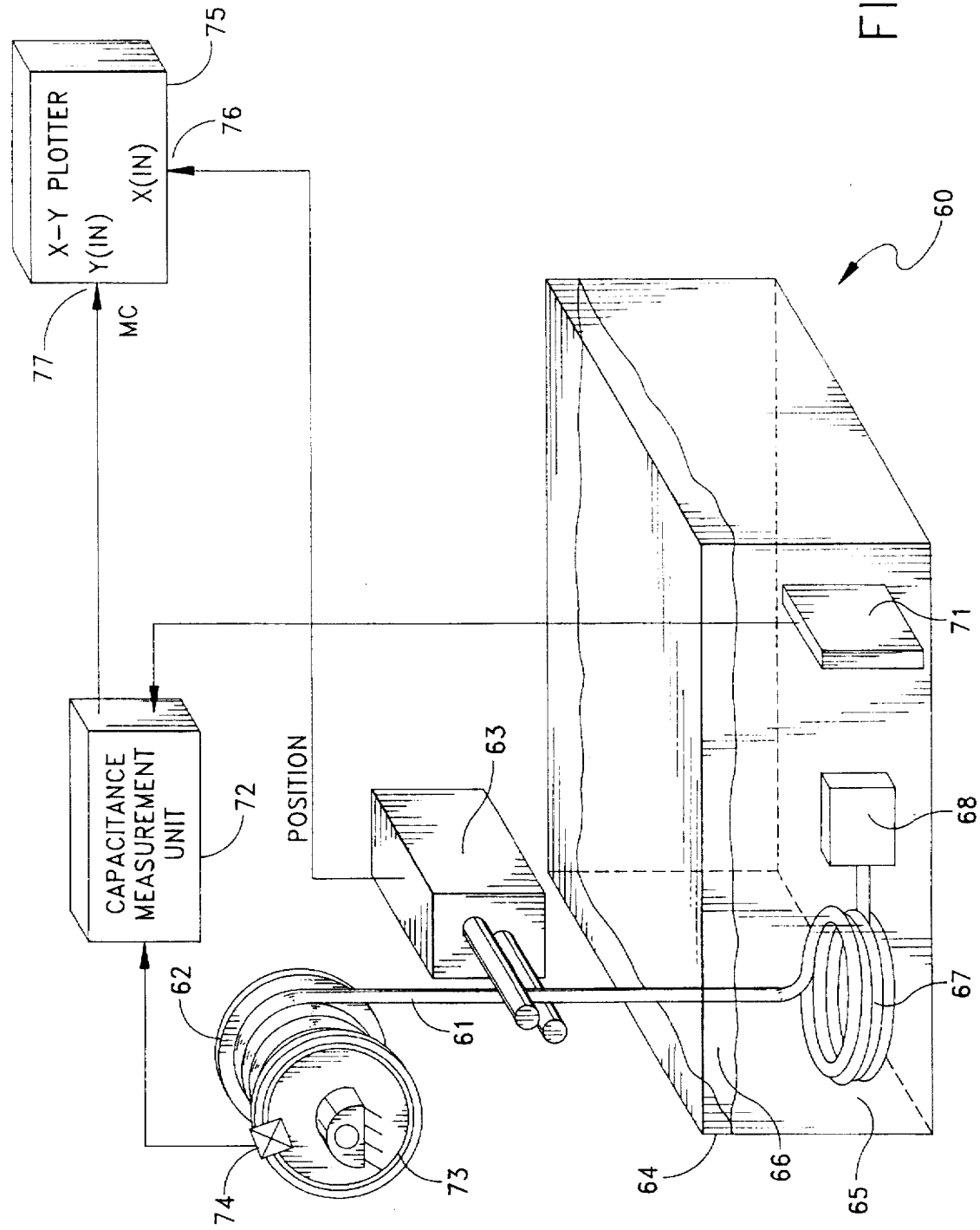

5,760,590

CABLE INTEGRITY TESTER

STATEMENT OF GOVERNMENT INTEREST

The invention described herein may be manufactured and used by or for the Government of the United States of America for governmental purposes without the payment of any royalties thereon or therefore.

BACKGROUND OF THE INVENTION (1) Field of the Invention

This invention generally relates to the testing of electrical cables and more particularly to methods and apparatus for testing electrical cables designed for underwater use.

(2) Description of the Prior Art

It is very useful to pretest cables prior to their use, particularly in applications in which the cable will be located in an underwater environment. Such testing would be particularly desirable if it could identify and locate the existence of nicks in armor jackets, porosity in the cable insulation and other defects or faults that could allow seawater to intrude into the cable and destroy its usefulness. It is even more advantageous if such tester identifies the location of the defect and can quantify the defect.

Prior art testing methods and apparatus have not provided all the desired information. Some, particularly tests wherein a high potential is applied to the cable, merely provide qualitative results. In some specific applications the tests can even be destructive. Other tests, such as megger tests that measure the resistance over a cable while a high voltage is applied, test bulk properties of cables and therefore can not locate the defect. Other tests, as now described, provide some, but not all of the desired information in a non-destructive fashion.

For example, U.S. Pat. No. 5,067,343 depicts apparatus for determining the water blocking qualities of a moisture blocking compound applied to the interstitial spaces of a stranded conductor to produce a water impervious cable construction. Basically the ends of a cable are treated with a moisture blocking compound and a sealing and supporting means is attached to the end for receiving a source of colored liquid. The resulting cable end then is monitored at the other end for determining the penetration of the colored liquid through the moisture blocking compound and the cable.

High voltage electrical testing, as disclosed in U.S. Pat. No. 2,794,170 to Gooding comprises the use of cable testing apparatus in which a portion of cable under test is led through a tank containing an electrolytic solution. High voltage is applied to an electrode surrounding the cable and faults are indicated when the leakage current produced during the application of the high voltage exceeds a threshold value. This approach incorporates the expense of a high voltage supply and further requires some means of locating the position of any leakage.

U.S. Pat. Nos. 3,015,774 and 3,047,800 to Eigen disclose a cable tester that applies a high voltage to a cable and monitors any resulting corona discharge. An entire spool of cable is located in an electrolytic solution in a grounded tank. High voltage applied to a conductor induces corona that is measured to indicate leakage. However, such a system is subject to errors produced by ambient electrical disturbances from other sources. Consequently a high-pass filter generates signals corresponding to radio frequencies including those generated by corona discharge and those ambient disturbances into an amplifier. A separate radio circuit produces signals corresponding only to the ambient disturbances. An amplifier subtracts the two signals to produce a pure corona display.

U.S. Pat. No. 4,517,510 to Clinton discloses apparatus for testing the insulation of electric wire or cable in which an insulated wire having one end grounded passes in an unaltered path to an unconfined stream of water to which an electrical potential has been applied. Pin holes, voids, or other faults in the insulation are detected by a current flowing from a variable voltage power supply through the wire to ground. A fault indicator provides a signal response of the current flow. Water remaining on the jacket after passing the stream is removed by a blower.

Each of the foregoing patents therefore discloses a cable tester characterized by incorporating a high voltage supply for energizing a conductor in a cable and thereafter measuring leakage from the conductor through the insulation and an electrolytic solution to ground. Each requires a high voltage supply and attendant controls particularly for isolating individuals from the high voltage. Some, such as the Eigen ('774) patent disclose the application of high voltage to an entire cable after it is immersed. Others only immerse successive portions of the cable. The Eigen ('800) patent discloses a magnetic drum structure for recording any corona disturbance twice in an attempt to avoid the influence of any outside interference. This patent also discloses a process for physically marking the insulation in response to the detection of corona. Corona testing has further disadvantages. For example, the voltages necessary to produce corona can sometimes damage a cable. Corona is a form of electrical interference and can disrupt the operations of other nearby equipment particularly communications equipment unless significant effort is made to isolate any radiation from the point of corona discharge. Consequently the various approaches using corona discharge including those disclosed in the foregoing patents, have not been widely accepted.

In another approach, described in U.S. Pat. No. 2,942,181, an ac signal is applied to the ends of an uninsulated conductor and a pair of insulated conductors wrapped around the uninsulated conductor. This connection is made to the end of the cable on the inside turn at a supply reel. The other end is directed through an electrolytic tank that fixes the length of the cable in an electrolytic solution and the position of the cable with respect to a grounded electrode in the tank. A take up reel draws the cable through the solution from the supply reel. With this arrangement the insulated conductors form one plate of a condenser and the uninsulated conductor, electrolytic solution and grounded electrode collectively form the other plate. The insulation around the insulated conductors forms a dielectric. When a fault enters the solution, current flows between the insulated and uninsulated conductors causing a detector in a bridge circuit to produce an indication that a fault has occurred. The operator then stops the cable and marks the defective part.

In U.S. Pat. No. 5,206,597 to Rivera et al. apparatus including a capacitive test fixture and an electrical impedance analyzer measures the volume of water in a cable based upon cable capacitance. The capacitive test fixture measures the electrical capacitance along the cable as the cable is fed through the test fixture that comprises two spaced, insulated, semi-circular electrodes. While this arrangement can indicate water intrusion, it does not indicate the existence of nicks or other faults that might in the future produce operating problems. Consequently this approach seems useful only for the analysis of cables that have been removed from underwater applications.

SUMMARY OF THE INVENTION

Therefore it is an object of this invention to provide a method and apparatus for testing the integrity of an electrical cable that monitors a wide variety of potential cable defects or faults.

Still another object of this invention is to provide a method and apparatus for testing the integrity of an electrical cable that automatically displays the location of any potential fault.

Still another object of this invention is to provide a method and apparatus for testing the quality of an electrical cable with minimal equipment that is readily operated in a safe fashion.

In accordance with one aspect of this invention, successive portions of an electrical cable with insulated conductors pass into an electrolyte. A position signal and a capacitance signal are generated indicating, at each instant, the portion of the cable passing through the electrolyte solution and the capacitance between an electrode in the electrolytic solution and the conductor. The resulting signals produce a graphical display of capacitance as a function of position thereby to indicate graphically and readily a variety of faults in the cable.

In accordance with another aspect of this invention, apparatus for testing the integrity of an electric cable of indeterminate length including an electrical conductor includes a tank for storing an aqueous solution with an electrode disposed in the tank for contacting the aqueous electrolyte. A guide located in the tank and spaced from the electrode passes the cable through the electrolyte in a spatial relationship to the electrode. A capacitance measurement apparatus generates a capacitance signal indicating the capacitance between the electrode and the portion of the conductor located in the guide. A distance measurement circuit generates a position signal indicating the position of the conductor portion in the guide relative to an end. A display connects to the capacitance measurement and distance measurement circuits for displaying the measured capacitance as a function of position.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

FIG. 4 is an alternative embodiment of the apparatus in FIG. 1; and

DESCRIPTION OF THE PREFERRED EMBODIMENT

Figure 1:
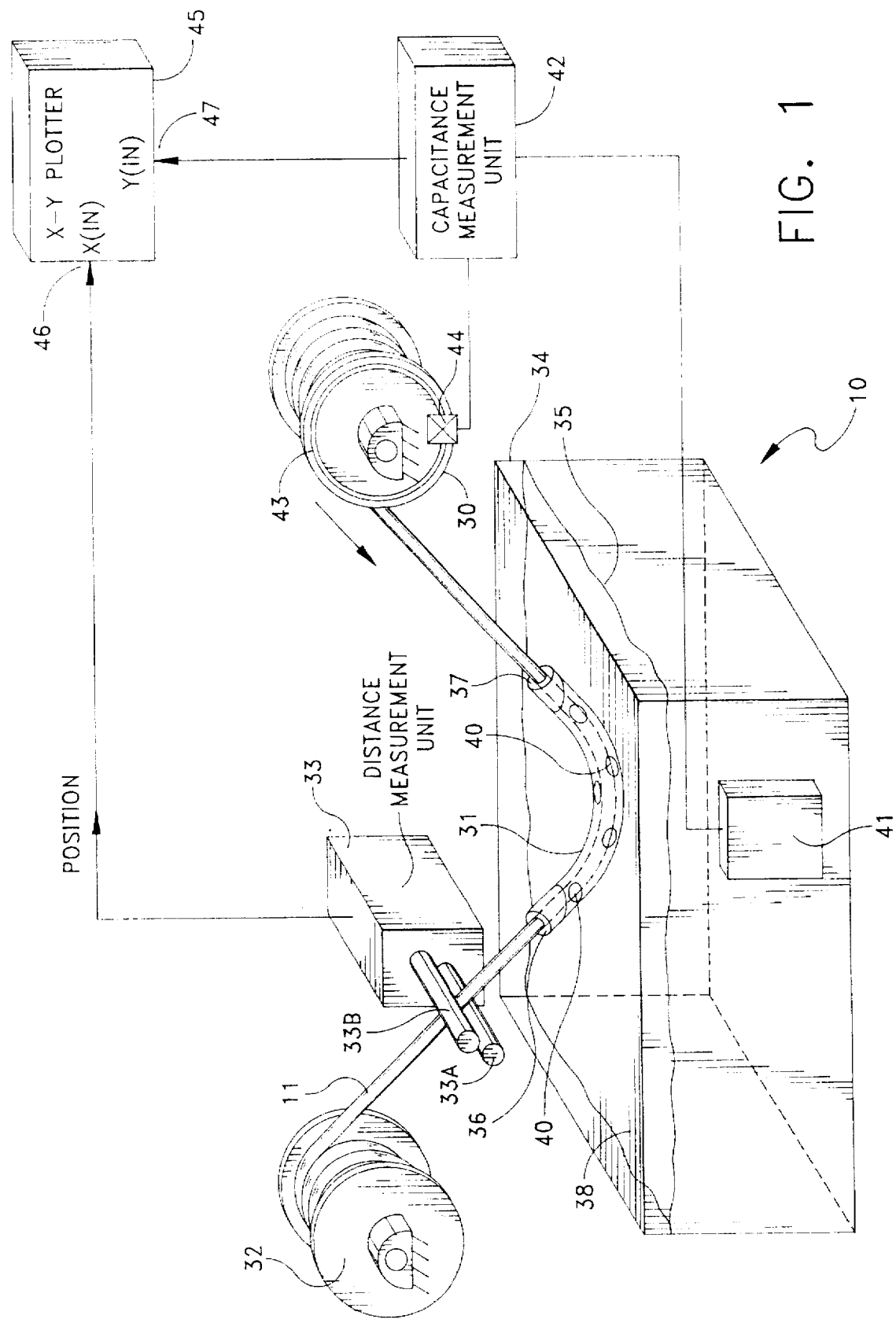
FIG. 1 is a perspective view of apparatus for testing the integrity of an electrical cable in accordance with this invention.
Figure 2A:
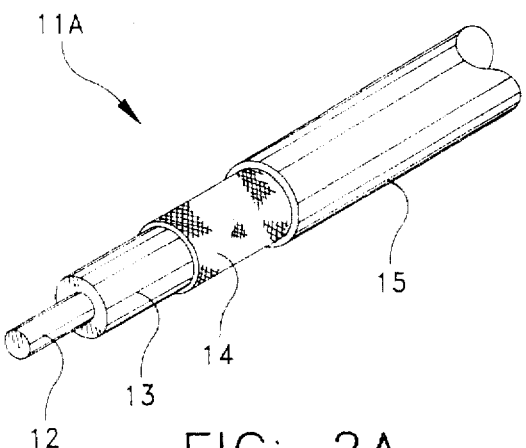
FIGS. 2A through 2C are perspective views depicting the construction of some of the cables that can be tested in the apparatus of FIG. 1.
Figure 2B:
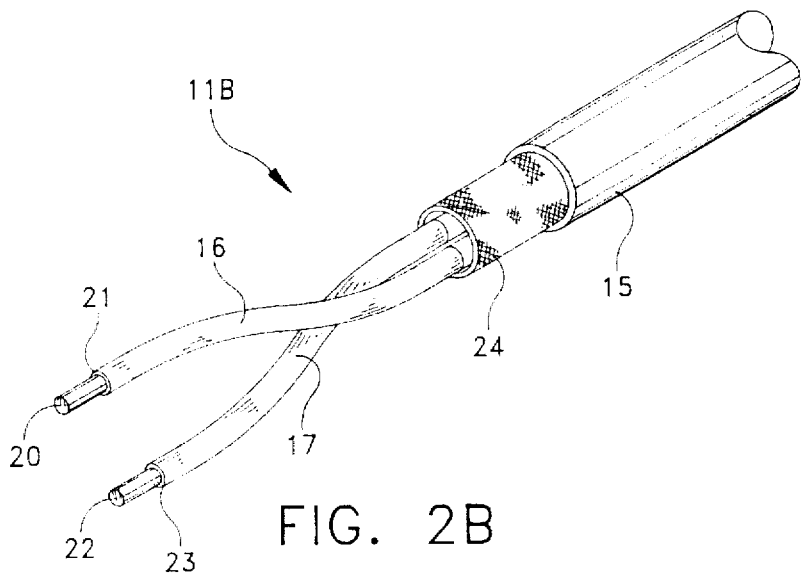
Figure 2C:
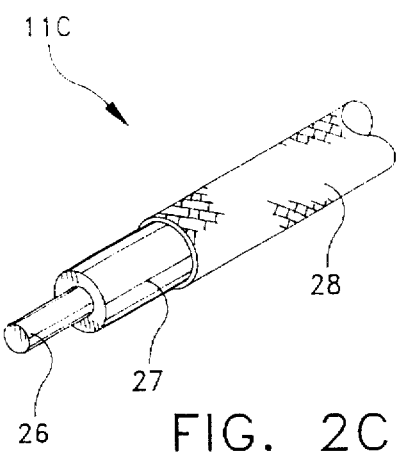

The apparatus 10 shown in FIG. 1 can test a variety of cable constructions. FIG. 2A, for example, discloses a conventional coaxial conductor cable 11A with a center conductor 12, an insulating portion 13, a conductive shield layer 14 and an outer insulating jacket 15. FIG. 2B discloses a shielded twisted pair cable 11B including conductors 16 and 17 that are twisted along the length of the cable. Conductor 16 includes a center conductor 20 and insulating jacket 21; the conductor 17, a center conductor 22 and an insulating jacket 23. The conductors 16 and 17 are twisted along their length with a shield conductor 24 that can lie inside an optional insulating jacket 25. FIG. 2C depicts an armored cable 11C with a center conductor 26, insulating jacket 27 and armored shield 28 that forms an outer surface of the conductor. It will be apparent that many variations of these and other cable constructions can be tested by the apparatus 10 in FIG. 1.

Apparatus 10 in FIG. 1 includes a conventional supply reel 30 from which successive portions of the cable 11 are drawn through a guide 31 to a take-up reel 32. A distance measurement unit 33 engages the cable 11 at some point intermediate the supply reel 30 and take-up reel 32 to generate a POSITION signal that indicates the length of the cable that has transferred from the supply reel 30 to the take-up reel 32. Consequently, the POSITION signal indicates the location of a portion of the cable 11 that is coextensive with the guide 31. Such distant measurement units are well-known. In this particular embodiment the distance measurement unit 33 is represented by rollers 33A and 33B that rotate as the cable 11 passes onto the take-up reel 32. The distance measurement unit 33 generates a position signal in analog or digital form in response to this rotation.

The guide 31 is disposed in a tank 34 containing an aqueous electrolyte 35 that can comprise water or water supplemented with a conductive salt. In a preferred form the dielectric constant of the aqueous electrolyte is about 80. The guide 30 has a finite length and a curved shape with ends 36 and 37 extending above the upper level or surface 38 of the electrolyte 35. A center portion lies below the level 38. Apertures 40 in the guide 31 that admit the electrolyte 35 into the intermediate portion of the guide 31 that acts as a pervious tube. Consequently the electrolyte 35 contacts successive portions of the cable 11 as successive portions of the cable 11 pass through the guide 31. Moreover, the electrolyte 35 contacts the outer surface comprising the insulating jacket 15 in FIG. 2A, insulating jacket 25 in FIG. 2B or the shield 24, if the jacket 25 were omitted, and the armored shield 28 in FIG. 2C.

The tank 34 additionally includes an electrode 41 that is spaced from the guide 31. Although the relative orientation of the guide tube 31 and electrode 41 is not are critical, in a preferred form the guide tube 31 and electrode 41 lie in parallel planes. The electrode 41 connects to one input of a capacitance measurement unit 42. The other input to the capacitance measurement unit 42 connects to one of the selected ones in the cables such as the conductor 12 or shield 14 in FIG. 2A, and the conductor 20, conductor 22 or shield 24 in FIG. 2B or the conductor 26 or the armor shield 28in FIG. 2C. Typically this connection will be made to the end of the cable at an innermost turn on the supply wheel 30. Such connections are also known. In FIG. 1 the connection is represented by an annular electrode 43 on the surface of the supply wheel 30. A contact 44, fixed in space, rides over the electrode 43 as it rotates while the cable 11 is transferred to the take-up reel 32. This contact 44 provides the second input to the capacitance measurement unit 42 that generates a Measured Capacitance (MC) signal.

In the embodiment shown in FIG. 1 non-selected conductors such as the conductor 14 in FIG. 2A, need to be electrically isolated from the selected conductor, such as the center conductor 12 in FIG. 2A. Therefore, the capacitance measurement unit 42 connects to a capacitor that includes the electrode 41 as one capacitor electrode and the selected one of the conductors in the cable 11 as the other electrode. The dielectric includes the electrolyte 35 and any insulation on the cable 11 intermediate the electrolyte 35 and the selected conductor. For example, in FIG. 2A if one selects the center conductor 12, the dielectric includes the electrolyte 35, the insulation 13 and the insulating jacket 15.

As previously indicated, the dielectric constant for the electrolyte 35 typically is greater than the dielectric constant for any insulating layers. For example, Neoprene rubber used in cables might have a dielectric constant in the range of 6 to 7. If any fault exists in the cable that allows water to intrude, the water intrusion effectively changes the composite dielectric between the electrode 41 and the selected electrode. The capacitance measurement unit 42 detects these changes and produces the MC output signal. Thus the MC signal will vary over time if physical conditions of the cable allow the electrolyte 35 to change the composite dielectric strength between the electrode 41 and the selected conductor.

There are many ways in which the MC signal from the measured capacitance unit 42 and position signal from the distance measurement unit 33 can be combined. An X-Y plotter 45 forms one such device. In this particular embodiment the POSITION signal energizes an X input 46; the MC signal, the Y input 47.

Figure 3A:
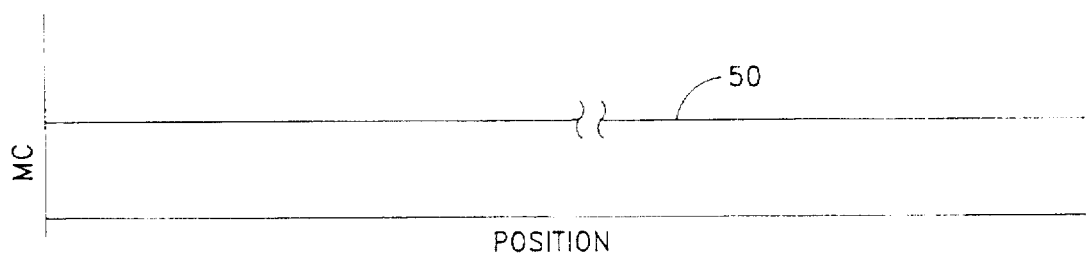
FIGS. 3A through 3D are graphs depicting the various outputs of the apparatus shown in FIG. 1.
Figure 3B:
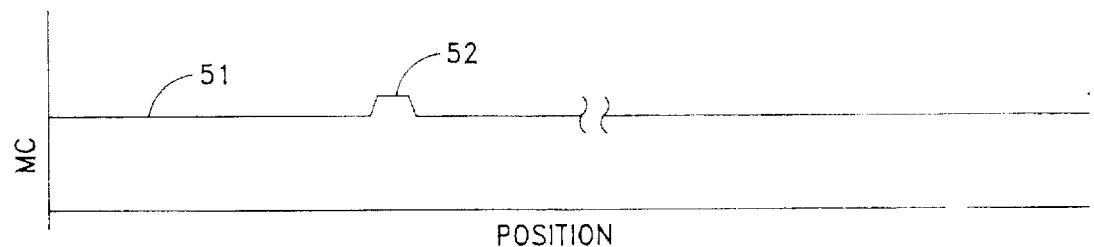
Figure 3C:
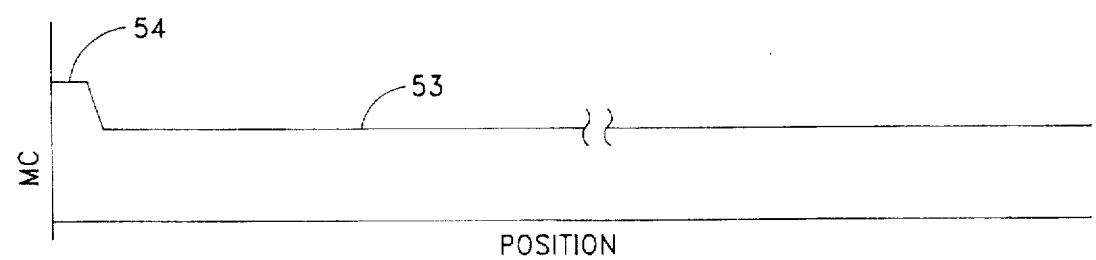
Figure 3D:
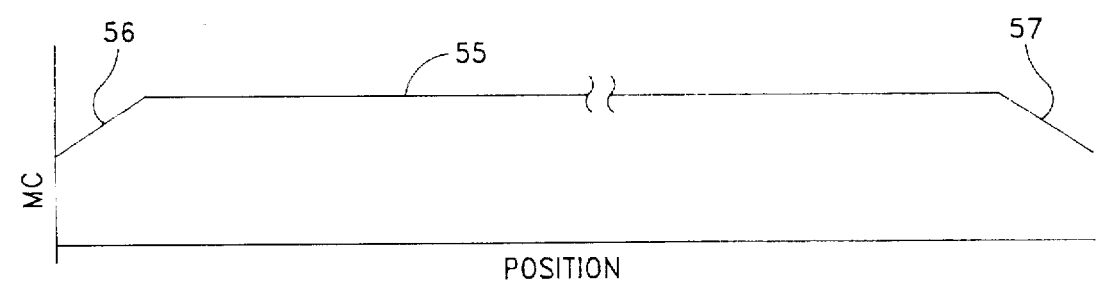

FIG. 3A depicts a graph 50 that shows a substantially constant value of the MC signal over position for the length of a cable 11. Such a constant capacitance signal indicates that the cable is free of any defects that might be caused by a failure in any insulating jacket, or any nicks or other voids in the insulation. FIG. 3B depicts a graph 51 that shows the same basic characteristics. A disturbance 52 represents a nick at a corresponding position on the cable 11 in FIG. 1. FIG. 3C depicts a cable that has a normal capacitance 53 except for a disturbance 54 that represents some kind of fault near the forward termination or the first end of the cable 11 to pass through the guide 31 in FIG. 1. FIG. 3D represents a cable with a general intrusion of water along the entire length of the jacket as represented by the increase of capacitance over a normal level at the terminations of the end portions 56 and 57.

It will now also be apparent that the resolution sensitivity of the this apparatus can be easily varied. Sensitivity for example, can be varied by changing the velocity at which the cable 11 passes through the guide tube 31. The spatial resolution can be improved by shortening the length of the guide 31 thereby to localize any fault to a greater degree. As will be apparent, however, shortening the guide 31 also tends to decrease sensitivity.

The apparatus 10 in FIG. 1 therefore meets all the objectives of this invention. It eliminates any requirement for high voltage sources. It logs the position of any fault without any requirement for stopping the apparatus for making measurements or otherwise physically marking the cable 11. It provides accurate measurements and fault location that can be varied by altering the speed or the length of the guide 31. Finally, the apparatus is readily adapted for automated operation.

FIG. 4 depicts an alternative embodiment of this invention that eliminates the guide 31 in FIG. 1. In this particular embodiment the apparatus 60 receives a cable 61 from a supply reel 32 after it passes through a distance measuring unit 63. The cable 61 transfers into a tank 64 containing an electrolyte 65 with an electrolyte surface 66. Whereas FIG. 1 depicts take-up reel 32, the apparatus 60 in FIG. 4 merely allows the cable 61 to accumulate in a pile 67 at the bottom of the tank 64 within the electrolyte 65. An isolator 68 attaches to the free end of the cable 61 to prevent the conductors in the cable from contacting each other or the electrolyte 65. Such isolators can be readily made. An electrode 71 disposed in the electrolyte 65 below the surface 66 provides one input to a capacitance measuring unit 72. An annular electrode and contact 74 connected to the end of the cable remaining on the supply reel 62 provides the other input to the capacitance measuring unit 72. As in FIG. 1, the capacitance measuring unit 72 generates a Measured Capacitance (MC) signal. An X-Y plotter 75 receives the POSITION signal at an X input 76 and the MC signal at an Y input 77 thereby to display the measured capacitance as a function of the length of cable that has passed into the tank 67.

Figure 5A:
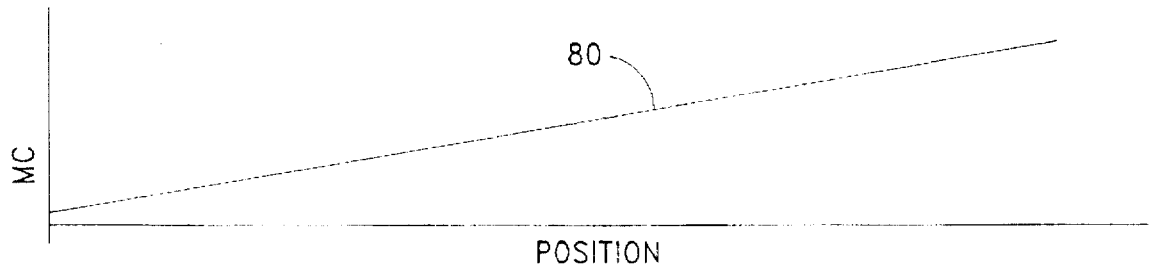
FIGS. 5A and 5B are graphs that depict the outputs of the apparatus shown in FIG. 4.
Figure 5B:
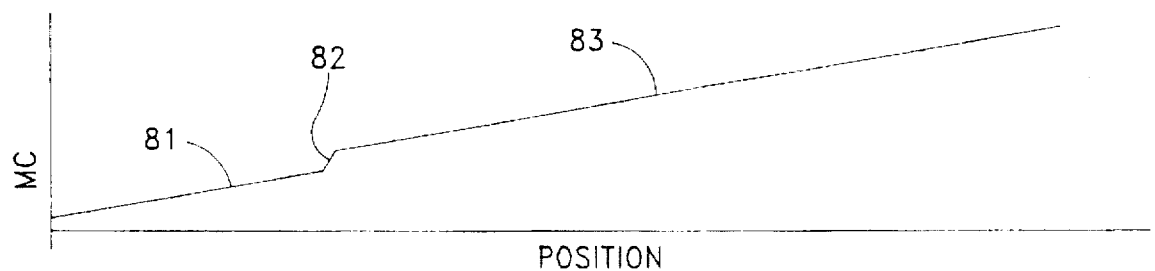

As will be apparent, the measured capacitance will be the capacitance between the electrode 71 and the accumulated cable 61 immersed in the electrolyte 65. FIG. 5A depicts the MC signal that results in a good cable producing an increasing capacitance value with a constant slope as additional cable transfers into the electrolyte. FIG. 5B depicts the MC signal that results from a cable with a nick. The cable produces a nominal graph 81 with a constant slope as the cable is introduced into the electrolyte. A nick in the cable produces an increase in capacitance as shown by graph 82. If that were the only fault in the cable, the remainder of the graph 83 would continue to rise at the same slope as the slope in the graph 81.

Thus the apparatus in FIG. 4 provides the same information as provided in the apparatus in FIG. 1. However, the graphs are somewhat more complicated to interpret given the constant change in capacitance that will occur as a normal event as the cable 61 accumulates in the tank. Nevertheless this apparatus meets the remaining objectives of this invention by eliminating the requirement for any high voltage system and by providing an apparatus that produces an indication of a fault and the location of that fault.

There have been disclosed two embodiments of a cable integrity tester that will indicate the general fault that could occur by water intrusion along the entire length of the cable or localized faults that might occur as a result of nicks or other faults at defined positions along the cable. The apparatus provides positive indication of the existence of the fault and its location. Moreover, the seriousness of any such fault will control the magnitude of any capacitance change. Those changes therefore can be examined qualitatively and quantitatively to gauge the seriousness of any such fault.

It will be apparent that many modifications can be made to the disclosed apparatus without departing from the invention. Therefore, it is the intent of the appended claims to cover all such variations and modifications as come within the true spirit and scope of this invention.

What is claimed is:

1. A tester for testing electrical cable of indeterminate length having a plurality of separate electrical conductors insulated from each other to identify a fault within the cable, said tester comprising:

a tank with an electrolyte and an electrode therein for receiving successive portions of the electrical cable at a location spaced from said electrode;

a capacitance measurement unit connected to said electrode and to one end of a selected conductor externally of said electrolyte for generating a capacitance signal indicating the capacitance between said electrode and the portion of the selected conductor located in said electrolyte;

a distance measurement unit that generates a position signal indicating the portion of the selected conductor in said electrolyte; and a display unit connected to said capacitance measurement unit and said distance measurement unit that displays the measured capacitance as a function of position in response to the capacitance and position signals whereby the location of a fault within the cable can be identified from said displayed measured capacitance as a function of position without marking the cable or electrically stressing the cable with a high voltage.

2. A tester as recited in claim 1 wherein said electrolyte comprises water and a conductive salt and has a dielectric constant of about 80.

3. A tester as recited in claim 1 wherein said display unit comprises an x–y plotter connected to receive the position signal as an x input and the capacitance signal as a y input thereby to display graphically the capacitance measurement as a function of cable position.

4. A tester as recited in claim 3 wherein the electrical cable is stored at a supply and wherein said tester includes:

means for directing the electrical cable from the supply into said tank whereby successive portions of the cable, beginning at a first end thereof, accumulate in said electrolyte; and means for electrically isolating the plurality of conductors at the first end from said electrolyte.

5. A tester as recited in claim 3 wherein the electrical cable is stored at a supply additionally comprising a guide located in said tank and spaced from said electrode for passing the successive portions of the cable through said electrolyte in a fixed spatial relationship to said electrode such that only that portion of the cable located in said guide contacts said electrolyte as successive portions of the cable are drawn from the supply.

6. A tester as recited in claim 5 wherein said guide comprises a pervious tube of a finite length having a portion thereof immersed in said electrolyte and the ends terminating externally of said electrolyte thereby to establish the length of the successive cable portions that contact said electrolyte.

7. A tester as recited in claim 1 additionally comprising:

a first reel for supplying the cable successively from a first end to a second end;

a connector that electrically connects the second end of the selected conductor to said capacitance measurement unit;

a guide located in said tank and spaced from said electrode for passing the successive portions of the cable through said electrolyte in a fixed spatial relationship to said electrode such that only that portion of the cable located in said guide contacts said electrolyte as successive portions of the cable are drawn from the supply; and a second reel for drawing the cable from said first reel through said guide.

8. A tester as recited in claim 7 wherein said electrolyte is a liquid having a dielectric constant of about 80 and said guide comprises a pervious tube.

9. A tester as recited in claim 8 wherein said display unit comprises an x–y plotter connected to receive the position signal as an x input and the capacitance signal as a y input thereby to display graphically the capacitance measurement as a function of cable position.

10. A tester for testing electrical cable of indeterminate length having a plurality of electrical conductors insulated from each other, said tester comprising:

tank means for storing an aqueous electrolyte;

electrode means disposed in said tank means for contacting said aqueous electrolyte;

guide means located in said tank means and spaced from said electrode means for passing successive portions of the cable through said electrolyte in a fixed spatial relationship to said electrode means, wherein said guide means comprises a pervious tube of a finite length oriented in said tank means with its end portions terminating externally of said electrolyte and its intermediate portion immersed in said electrolyte such that only that portion of the cable located in the immersed portion of said pervious tube contacts said electrolyte as successive portions of the cable are drawn from the supply whereby the length of the immersed portion of said pervious tube establishes the length of the successive portions that contact said electrolyte;

capacitance measurement means connected to said electrode means and to one end of a selected one of said plurality of electrical conductors for generating a capacitance signal indicating the capacitance between said electrode means and the portion of the selected one of said plurality of electrical conductors located in said guide means;

distance measurement means for generating a position signal indicating the position of the selected conductor portion in said guide means relative to an end of the cable; and display means connected to said capacitance measurement means and said distance measurement means for displaying the measured capacitance as a function of position in response to the capacitance and position signals whereby the location of a fault within the cable can be identified from said displayed measured capacitance as a function of position without marking the cable or electrically stressing the cable with a high voltage.

11. A tester as recited in claim 10 wherein said display unit comprises an x–y plotter connected to receive the position signal as an x input and the capacitance signal as a y input thereby to display graphically the capacitance measurement as a function of cable position.

12. A tester as recited in claim 11 additionally comprising:

first reel means for supplying the cable;

a connector that electrically connects the selected one of said plurality of conductors to said capacitance measurement unit; and second reel means for drawing the cable from said first reel means through said guide means.

* * * * *